US012748473B2

(12) United States Patent
Sun

(10) Patent No.: US 12,748,473 B2
(45) Date of Patent: Sep. 29, 2026

(54) CORRECTION METHOD FOR STABILIZING OUTPUT OF VR INVERTER AND RELATED ASSEMBLY

(71) Applicant: SUZHOU METABRAIN INTELLIGENT TECHNOLOGY CO., LTD., Suzhou (CN)

(72) Inventor: Hui Sun, Suzhou (CN)

(73) Assignee: SUZHOU METABRAIN INTELLIGENT TECHNOLOGY CO., LTD., Suzhou (CN)

(*) Notice: Subject to any disclaimer, the term of this patent is extended or adjusted under 35 U.S.C. 154(b) by 115 days.

(21) Appl. No.: 18/705,934

(22) PCT Filed: Dec. 22, 2022

(86) PCT No.: PCT/CN2022/141131

§ 371 (c)(1),
(2) Date: Apr. 29, 2024

(87) PCT Pub. No.: WO2023/173873

PCT Pub. Date: Sep. 21, 2023

(65) Prior Publication Data

US 2024/0419228 A1 Dec. 19, 2024

(30) Foreign Application Priority Data

Mar. 18, 2022 (CN) ........................ 202210266998.4

(51) Int. Cl.
*G06F 1/26* (2006.01)
*G01R 19/165* (2006.01)
(Continued)

(52) U.S. Cl.
CPC ........... *G06F 1/26* (2013.01); *G01R 19/1659* (2013.01); *G01R 19/2503* (2013.01); *H02M 7/44* (2013.01)

(58) Field of Classification Search
None
See application file for complete search history.

(56) References Cited

U.S. PATENT DOCUMENTS 8,405,369 B1 * 3/2013 Kahn .................... H02M 3/156 323/284
2004/0267486 A1 * 12/2004 Percer ...................... G06F 11/24 714/E11.154
(Continued)

FOREIGN PATENT DOCUMENTS

CN 111828363 A 10/2020
CN 112129994 A 12/2020
(Continued)

OTHER PUBLICATIONS

Machine Translation of CN112129994, Espacenet (Year: 2020).*

*Primary Examiner* — Danny Chan
(74) *Attorney, Agent, or Firm* — IPro, PLLC

(57) ABSTRACT

Disclosed are a correction method and a related assembly. According to a solution, loading is performed on an electronic load, and during each loading, a digital multimeter collects the output voltage of a VR inverter; after loading is ended, it is determined whether the average voltage value of the output voltage collected by the digital multimeter is within a preset voltage range, so as to determine whether the VR inverter stably performs output; and when the average voltage value is not within the preset voltage range, it can be determined that the output of the VR inverter is unstable, and it is needed to correct the VR inverter, i.e., the correction of the VR inverter is realized by adjusting the impedance of a digital potentiometer arranged between the output end and the feedback end of the VR inverter.

19 Claims, 2 Drawing Sheets

(51) Int. Cl.
*G01R 19/25* (2006.01)
*H02M 7/44* (2006.01)

(56) References Cited

U.S. PATENT DOCUMENTS

| | | | | |
|---|---|---|---|---|
| 2011/0279145 | A1* | 11/2011 | Chen | G06F 1/305 324/764.01 |
| 2017/0331391 | A1 | 11/2017 | Ichikawa et al. | |
| 2019/0065295 | A1* | 2/2019 | Hsieh | G06F 3/0625 |
| 2021/0081342 | A1* | 3/2021 | Ooi | G06F 11/3471 |

FOREIGN PATENT DOCUMENTS

| | | | |
|---|---|---|---|
| CN | 113991745 | A | 1/2022 |
| CN | 114362481 | A | 4/2022 |

* cited by examiner

CORRECTION METHOD FOR STABILIZING OUTPUT OF VR INVERTER AND RELATED ASSEMBLY

CROSS-REFERENCE TO RELATED APPLICATION

This disclosure claims the priority to Chinese Patent Application No. 202210266998.4, filed to the China National Intellectual Property Administration on Mar. 18, 2022 and entitled “CORRECTION METHOD AND RELATED ASSEMBLY”, the disclosure of which is hereby incorporated by reference in its entirety.

FIELD

The disclosure relates to the field of server power supply, and more particularly, to a correction method and a related assembly.

BACKGROUND

In the design of the server, the 12V power output from a PSU (Power Supply Unit) is converted to different voltage levels by different VR (Voltage Adjustment) inverters, so as to supply power to various components in the server, e.g., a mechanical hard disk requires 5V supply voltage, a BMC requires 1.2V supply voltage, a CPLD (Complex Programmable Logic Device) and a OCP network card requires 3.3V supply voltage etc. These components have certain requirements for the voltage range of the required supply voltage. Only if the voltage level output from the VR inverter is within the voltage range required for normal operation of the corresponding component, the component can operate normally. On the contrary, if the voltage level is above or below the voltage range required for the normal operation of the component, the component will not operate normally, and may even be damaged.

SUMMARY

An objective of the disclosure is to provide a correction method and a related assembly, in which when the output of a VR inverter is determined to be unstable based on an electronic load and a digital multimeter and a correction is required, the correction is performed by a digital potentiometer to ensure the stable output of the VR inverter.

To solve the above technical problem, the disclosure provides a correction method, the correction method is applied to a processor, a correction device includes an electronic load and a digital multimeter both connected to an output terminal of a VR inverter in a server, and a digital potentiometer provided between the output terminal and a feedback terminal of the VR inverter, a control terminal of the digital potentiometer is connected to a BMC in the server, a first data exchange terminal of the processor is connected to a data exchange terminal of the BMC, a second data exchange terminal of the processor is connected to a control terminal of the electronic load and an output terminal of the digital multimeter, and the method includes:

load-pulling the electronic load at a predetermined frequency, a predetermined step and a predetermined maximum load-pull current to load-pull a current of the VR inverter until a load-pull current of the VR inverter is the predetermined maximum load-pull current;

determining whether an average voltage value of output voltage of the VR inverter collected by the digital multimeter after each load-pulling of the electronic load is within the predetermined voltage range at the end of load-pulling; and adjusting an impedance of the digital potentiometer by the BMC until the average voltage value is within the predetermined voltage range when the average voltage value of output voltage of the VR inverter collected by the digital multimeter is not within the predetermined voltage range.

In some embodiments, the adjusting the impedance of the digital potentiometer by the BMC until the average voltage value is within the predetermined voltage range includes:

S21: adjusting the impedance of the digital potentiometer by the BMC;

S22: load-pulling the electronic load at the predetermined frequency, the predetermined step and the predetermined maximum load-pull current to load-pull the current of the VR inverter;

S23: determining the output voltage of the VR inverter collected by the digital multimeter after each load-pulling of the electronic load;

S24: calculating an average voltage value of the output voltage of the VR inverter during the load-pulling of the current of the electronic load after the load-pull current of the VR inverter is the predetermined maximum load-pull current;

S25: determining whether the average voltage value is within the predetermined voltage range, and proceeding to step S26 when the average voltage value is within the predetermined voltage range, and returning to step S21 when the average voltage value is not within the predetermined voltage range; and

S26: generating information that the VR inverter is ready for operation.

In some embodiments, the determining the output voltage of the VR inverter collected by the digital multimeter after each load-pulling of the electronic load includes:

determining the output voltage of the VR inverter collected by the digital multimeter after a predetermined interval after each load-pulling of the electronic load.

In some embodiments, the load-pulling the electronic load at the predetermined frequency, the predetermined step and the predetermined maximum load-pull current to load-pull the current of the VR inverter until the load-pull current of the VR inverter is the predetermined maximum load-pull current includes:

S41: setting a number of times for a first load-pulling as a current number of times for load-pulling;

S42: load-pulling the electronic load for the current number of times;

S43: determining current output voltage of the VR inverter collected by the digital multimeter;

S44: determining whether the load-pull current of the VR inverter is the predetermined maximum load-pull current, and proceeding to step S45 when the load-pull current of the VR inverter is not the predetermined maximum load-pull current, and proceeding to step S46 when the load-pull current of the VR inverter is the predetermined maximum load-pull current;

S45: setting next number of the current number of times as the current number of times and returning to step S42 after a predetermined time, wherein a difference between the load-pull current of the VR inverter after load-pulling for the current number of times and the load-pull current of the VR inverter after load-pulling for previous number time of the current number of times is the predetermined step; and

S46: determining whether the average voltage value of the output voltage of the VR inverter collected by the digital multimeter after each load-pulling of the electronic load is within the predetermined voltage range at the end of load-pulling.

In some embodiments, the adjusting the impedance of the digital potentiometer by the BMC until the average voltage value is within the predetermined voltage range includes:

adjusting the impedance of the digital potentiometer to decrease the impedance of the digital potentiometer when the average voltage value is greater than a maximum value of the predetermined voltage range, so that the average voltage value is within the predetermined voltage range; and adjusting the impedance of the digital potentiometer to increase the impedance of the digital potentiometer when the average voltage value is less than a maximum value of the predetermined voltage range, so that the average voltage value is within the predetermined voltage range.

In some embodiments, a voltage collection terminal of the BMC is connected to the output terminal of the VR inverter, and the load-pulling the electronic load at the predetermined frequency, the predetermined step and the predetermined maximum load-pull current to load-pull the current of the VR inverter until the load-pull current of the VR inverter is the predetermined maximum load-pull current further includes:

determining a voltage correction coefficient of the BMC based on output voltage of the VR inverter collected by the BMC and the output voltage of the VR inverter collected by the digital multimeter after each load-pulling of the electronic load at the end of load-pulling; and correcting a voltage monitoring value of the BMC based on the voltage correction coefficient.

In some embodiments, the determining the voltage correction coefficient of the BMC based on the output voltage of the VR inverter collected by the BMC and the output voltage of the VR inverter collected by the digital multimeter after each load-pulling of the electronic load at the end of load-pulling includes:

determining voltage offsets obtained by dividing the output voltage of the VR inverter collected by the BMC by the output voltage of the VR inverter collected by the digital multimeter after each load-pulling of the electronic load at the end of load-pulling;

calculating an average value of the voltage offsets which is the voltage correction coefficient; and correcting the voltage monitoring value of the BMC based on the voltage correction coefficient includes:

multiplying the output voltage of the VR inverter collected by the BMC by the voltage correction coefficient.

To solve the above technical problem, the disclosure provides a correction system, wherein the correction system is applied to a processor, a correction device includes an electronic load and a digital multimeter both connected to an output terminal of a VR inverter in a server, and a digital potentiometer provided between the output terminal and a feedback terminal of the VR inverter, a control terminal of the digital potentiometer is connected to a BMC in the server, a first data exchange terminal of the processor is connected to a data exchange terminal of the BMC, a second data exchange terminal of the processor is connected to a control terminal of the electronic load and an output terminal of the digital multimeter, and the system includes:

a load-pull unit for load-pulling the electronic load at a predetermined frequency, a predetermined step and a predetermined maximum load-pull current to load-pull a current of the VR inverter until a load-pull current of the VR inverter is the predetermined maximum load-pull current;

a determination unit for determining whether an average voltage value of output voltage of the VR inverter collected by the digital multimeter after each load-pulling of the electronic load is within the predetermined voltage range at the end of the load-pulling; and an adjustment unit for adjusting an impedance of the digital potentiometer by the BMC until the average voltage value is within the predetermined voltage range when the average voltage value of output voltage of the VR inverter collected by the digital multimeter is not within the predetermined voltage range.

To solve the above technical problem, the disclosure provides a correction device, including:

a memory for storing a computer program;

a processor for executing the computer program to implement steps of the above correction method.

To solve the above technical problem, the disclosure provides a computer non-transitory readable storage medium on which a computer program is stored, and the computer program is executed by the processor to implement steps of the above correction method.

The disclosure provides a correction method and related assembly, in which an electronic load is load-pulled, and output voltage of a VR inverter is collected by a digital multimeter for each load-pulling. It is determined whether an average voltage value of output voltage collected by the digital multimeter is within the predetermined voltage range at the end of load-pulling, so as to determine whether the output of the VR inverter is stable. When the average voltage value is not within the predetermined voltage range, it is determined that the output of the VR inverter is unstable and the VR inverter needs to be corrected, that is, the VR inverter is corrected by adjusting the impedance of the digital potentiometer between the output terminal and the feedback terminal of the VR inverter. It can be seen that in the disclosure, when the output of the VR inverter is determined to be unstable based on the electronic load and the digital multimeter, and the VR inverter needs to be corrected, the digital potentiometer corrected it to ensure the stable output of the VR inverter.

BRIEF DESCRIPTION OF THE DRAWINGS

In order to more clearly illustrate the technical solutions of the embodiments of the disclosure, the figures that are required to describe the embodiments of the disclosure will be briefly described below. Apparently, the figures that are described below are merely a part of the embodiments of the disclosure, and a person skilled in the art can obtain other figures according to these figures without paying creative work.

DETAILED DESCRIPTION

The core of the disclosure is to provide a correction method and a related assembly, in which when the output of a VR inverter is determined to be unstable based on an electronic load and a digital multimeter, and a correction is required, the correction is performed by a digital potentiometer to ensure the stable output of the VR inverter.

In order to make the objectives, technical solutions and advantages of the embodiments of the disclosure clearer, the technical solutions according to the embodiments of the disclosure will be clearly and completely described below with reference to the drawings according to the embodiments of the disclosure. Apparently, the described embodiments are merely a part of the embodiments of the disclosure, rather than all of the embodiments. All of the other embodiments that a person skilled in the art obtains on the basis of the embodiments of the disclosure without paying creative work fall within the protection scope of the disclosure.

Figure 1:
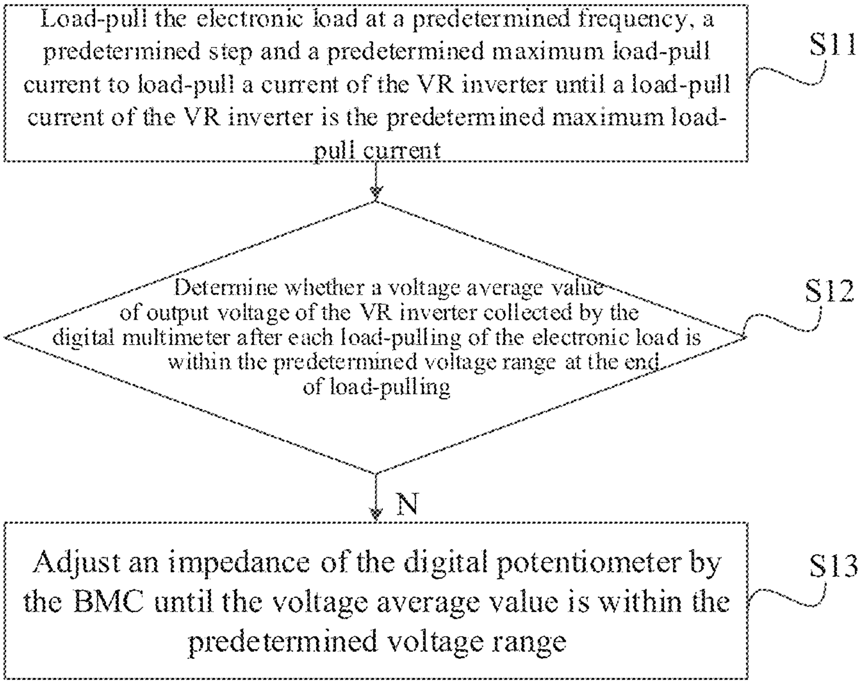
FIG. 1 is a flowchart of a correction method provided in the disclosure.

Referring to FIG. 1, FIG. 1 is a flowchart of a correction method provided in the disclosure, which is applied to a processor. A correction device includes an electronic load and a digital multimeter both connected to an output terminal of a VR inverter in a server, and a digital potentiometer R provided between an output terminal and a feedback terminal of the VR inverter.

A control terminal of the digital potentiometer R is connected to a BMC (Baseboard Management Controller) in the server. A first data exchange terminal of the processor is connected to a data exchange terminal of the BMC, and a second data exchange terminal of the processor is connected to a control terminal of the electronic load and an output terminal of the digital multimeter. The method includes S11-S13.

In S11, the electronic load is load-pulled at a predetermined frequency, a predetermined step and a predetermined maximum load-pull current to load-pull the current of the VR inverter until a load-pull current of the VR inverter is the predetermined maximum load-pull current.

The applicant considers that the VR inverter requires a stable output to supply power to various components in the server to ensure normal operations of various components. If the output of the VR inverter is unstable, the power supply for the components is insufficient, or the power supply is too high, resulting in damage to the components.

Figure 2:
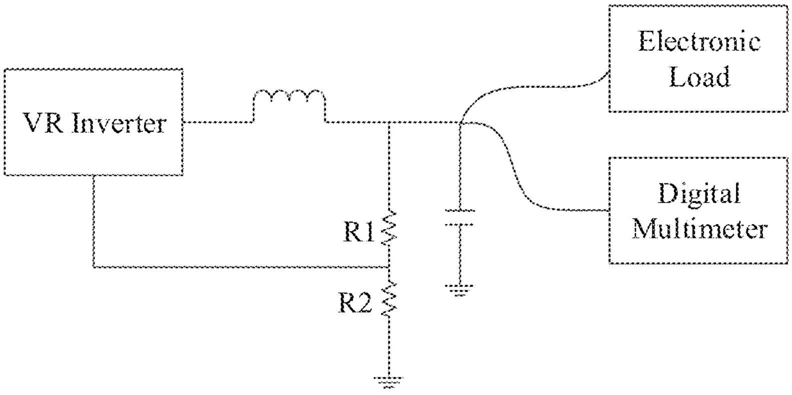
FIG. 2 is a schematic diagram of a correction device in the prior art.

In the prior art, in order to ensure the stable output of the VR inverter, the electronic load is usually load-pulled manually. The output voltage of the VR inverter is changed by changing the load-pull current of the VR inverter. The output voltage of the VR inverter is collected by the digital multimeter. The staff reads the output voltage read by the digital multimeter after each load-pulling of the electronic load, so as to manually determine whether the output of the VR inverter is stable. If it is determined that the output of the VR inverter is stable, the VR inverter is directly put into use. However, if the output of the VR inverter is unstable, it is necessary to correct the VR inverter. As shown in FIG. 2, FIG. 2 is a schematic diagram of a correction device in the prior art. In the prior art, the VR inverter is corrected by changing resistance values of a pull-up resistor R1 or a pull-down resistor R2 between the output terminal and the feedback terminal of the VR inverter in FIG. 2, that is, it is necessary to manually dissemble, replace and weld the pull-up resistor R1 or the pull-down resistor R2, and load-pull the electronic load again, so as to determine whether the output of the VR inverter is stable after the pull-up resistor R1 or the pull-down resistor R2 is replaced. If the output of the VR inverter is unstable, it is necessary to replace the pull-up resistor R1 or the pull-down resistor R2 again, which not only suffers from low correction efficiency and correction errors, but also affects wiring effect of the feedback terminal of the VR inverter. Due to continuous disassembling and welding of resistors, the board where the VR inverter is located will also be damaged.

In order to solve the above technical problems, in the disclosure, the processor controls the load-pulling of the electronic load to change the current of the VR inverter, so as to change the output voltage of the VR inverter. The step of each load-pulling is the predetermined step, and the frequency of each load-pulling is the predetermined frequency. The load-pulling stops when the current of the VR inverter is load-pulled to the predetermined maximum load-pull current. The predetermined step may be, but is not limited to, 10% of the predetermined maximum load-pull current.

In addition, the electronic load may be unloaded when the current of the VR inverter is the predetermined maximum load-pull current, until the current of the VR inverter is the minimum current.

When the electronic load is load-pulled, the output voltage of the VR inverter will change once for each load-pulling. It is determined whether the VR inverter is stable in operation by the output voltage of the VR inverter each time, so that when the output of the VR inverter is unstable, the VR inverter is corrected to ensure that the VR inverter stably supplies power to various components in the server.

In S12, it is determined whether an average voltage value of output voltage of the VR inverter collected by the digital multimeter after each load-pulling of the electronic load is within the predetermined voltage range at the end of load-pulling.

During the load-pulling of the electronic load, the digital multimeter detects the output voltage of the VR inverter once for each load-pulling. The average voltage value of the output voltage of the VR inverter collected by the digital multimeter is calculated at the end of load-pulling. For example, when the predetermined step is 10% of the predetermined maximum load-pull current, the electronic load is load-pulled for a total of 10 times. The digital multimeter collects the output voltage of the VR inverter for 10 times, and calculates an average voltage value of the output voltage of the VR inverter collected for 10 times. When the calculated average voltage value is within the predetermined voltage range, it can be determined that the output of the VR inverter is stable, and if the average voltage value is not within the predetermined voltage range, it can be determined that the output of the VR inverter is unstable, and it is necessary to correct the VR inverter to ensure the stability of the power supply.

In S13, when the average voltage value is not within the predetermined voltage range, an impedance of the digital potentiometer R is adjusted by the BMC until the average voltage value is within the predetermined voltage range.

Figure 3:
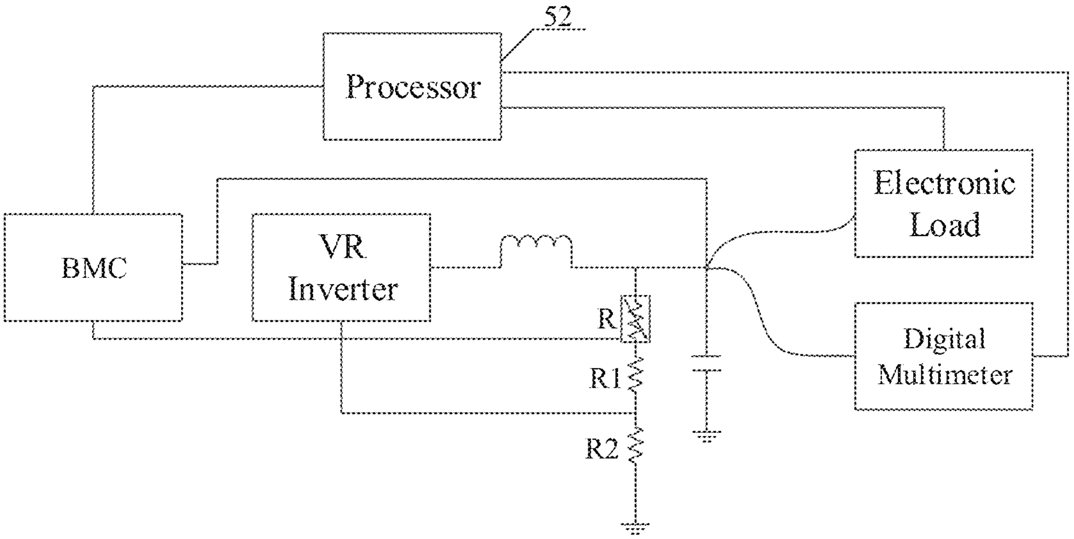
FIG. 3 is a schematic diagram of a correction device provided in the disclosure.

As shown in FIG. 3, FIG. 3 is a schematic diagram of a correction device provided in the disclosure. The disclosure differs from the prior art in that the correction device of the disclosure is provided with a digital potentiometer R between the output terminal and the feedback terminal of the VR inverter. As can be seen in FIG. 3, a first terminal of the digital potentiometer R is connected to the output terminal of the VR inverter, a second terminal of the digital potentiometer R is connected to the pull-up resistor R1, and the control terminal of the digital potentiometer R is connected to the BMC. In the disclosure, when the VR inverter is corrected, the BMC adjusts the impedance of the digital potentiometer R. By increasing or decreasing the impedance of digital potentiometer R, it can be determined that the VR inverter has been corrected to stable output when the average voltage value is within the predetermined voltage range. If the average voltage value is not within the predetermined voltage range after adjusting the impedance of the digital potentiometer R, the impedance of the digital potentiometer R is adjusted until the average voltage value falls within the predetermined voltage range.

As an embodiment, adjusting the impedance of the digital potentiometer R by the BMC until the average voltage value is within the predetermined voltage range includes:

- S21: adjusting the impedance of the digital potentiometer R by the BMC;
- S22: load-pulling the electronic load at the predetermined frequency, the predetermined step and the predetermined maximum load-pull current to load-pull the current of the VR inverter;
- S23: determining the output voltage of the VR inverter collected by the digital multimeter after each load-pulling of the electronic load;
- S24: calculating an average voltage value of the output voltage of the VR inverter during the load-pulling of the current of the electronic load after the load-pull current of the VR inverter is the predetermined maximum load-pull current;
- S25: determining whether the average voltage value is within the predetermined voltage range, and proceeding to step S26 when the average voltage value is within the predetermined voltage range, and returning to step S21 when the average voltage value is not within the predetermined voltage range; and
- S26: generating information that the VR inverter is ready for operation.

In this embodiment, after the impedance of the digital potentiometer R is adjusted by the BMC, the electronic load is load-pulled again to determine whether the average voltage value of the corrected VR inverter is within the predetermined voltage range. If the average voltage value of the corrected VR inverter is within the predetermined voltage range, the information that the VR inverter is ready for operation can be generated, that is, the VR inverter does require further correction, and it can be applied to supply power to the components in the server. If the average voltage value of the corrected VR inverter is still not within the predetermined voltage range, it is necessary to continue to correct the VR inverter until the average voltage value of the VR inverter is within the predetermined voltage range again, so as to ensure that the VR inverter can stably supply power to various components in the server.

It should be noted that the average voltage value calculated before the VR inverter is corrected by the digital potentiometer R to the average voltage value calculated when the average voltage value of the VR inverter is finally determined to be within the predetermined voltage range may be sequentially named as a first average voltage value, a second average voltage value, etc., and so forth, so as to distinguish various average voltage values.

As an embodiment, determining the output voltage of the VR inverter collected by the digital multimeter after each load-pulling of the electronic load includes:

- determining the output voltage of the VR inverter collected by the digital multimeter after a predetermined interval after each load-pulling of the electronic load.

For obtaining the output voltage of the VR inverter collected by the digital multimeter, in some embodiments, the output voltage of the VR inverter collected by the digital multimeter is obtained after the predetermined interval after the load-pulling of the electronic load, so as to ensure that the collected output voltage is the voltage of the VR inverter after the load-pull current of the VR inverter is stable, and to ensure the accuracy of the collected output voltage.

As an embodiment, the adjusting the impedance of the digital potentiometer R by the BMC until the average voltage value is within the predetermined voltage range includes:

- adjusting the impedance of the digital potentiometer R to decrease the impedance of the digital potentiometer R when the average voltage value is greater than a maximum value of the predetermined voltage range, so that the average voltage value is within the predetermined voltage range; and
- adjusting the impedance of the digital potentiometer R to increase the impedance of the digital potentiometer R when the average voltage value is less than a maximum value of the predetermined voltage range, so that the average voltage value is within the predetermined voltage range.

In addition, the impedance of the digital potentiometer R is adjusted by the BMC. When the average voltage value is greater than the maximum value of the predetermined voltage range, the impedance of the digital potentiometer R is decreased to increase the output voltage of the VR inverter and the average voltage value, so that the average voltage value is within the predetermined voltage range. When the average voltage value is less than the minimum value of the predetermined voltage range, the impedance of the digital potentiometer R is increased to decrease the output voltage of the VR inverter and the average voltage value so that the average voltage value is within the predetermined voltage range, and a stable output of the VR inverter is ensured.

It should also be noted that the processor of the disclosure may, but is not limited to, obtain the output voltage collected by the digital multimeter or control the electronic load via a GPIB bus, and may, but is not limited to, interact with the BMC for data exchange via a serial bus. When the BMC controls the digital potentiometer R, it may, but is not limited to, transmit control signals via a I2C bus.

In addition, the automatic determination and correction of the VR inverter by the processor also reduces the influence of errors caused by human subjective judgment.

In summary, in the disclosure, when the output of the VR inverter is determined to be unstable based on the electronic load and the digital multimeter and the VR inverter needs to be corrected, the digital potentiometer R corrects it to ensure the stable output of the VR inverter.

Based on the Above Embodiments:

As an embodiment, the load-pulling the electronic load at the predetermined frequency, the predetermined step and the predetermined maximum load-pull current to load-pull the current of the VR inverter until the load-pull current of the VR inverter is the predetermined maximum load-pull current includes:

- S41: setting a number of times for a first load-pulling as a current number of times for load-pulling;
- S42: load-pulling the electronic load for the current number of times;

S43: determining current output voltage of the VR inverter collected by the digital multimeter;

S44: determining whether the load-pull current of the VR inverter is the predetermined maximum load-pull current, and proceeding to step S45 when the load-pull current of the VR inverter is not the predetermined maximum load-pull current, and proceeding to step S46 when the load-pull current of the VR inverter is the predetermined maximum load-pull current;

S45: setting next number of the current number of times as the current number of times and returning to step S42 after a predetermined time, wherein a difference between the load-pull current of the VR inverter after load-pulling for the current number of times and the load-pull current of the VR inverter after load-pulling for previous number time of the current number of times is the predetermined step; and S46: determining whether the average voltage value of the output voltage of the VR inverter collected by the digital multimeter after each load-pulling of the electronic load is within the predetermined voltage range at the end of load-pulling.

In this embodiment, the electronic load is load-pulled. The current output voltage of the VR inverter collected by the digital multimeter is determined for each load-pulling. If the load-pull current of the VR inverter has not reached the predetermined maximum load-pull current, the electronic load will be load-pulled after the predetermined time. It should be noted that the predetermined time is a period corresponding to the predetermined frequency, that is, the electronic load is load-pulled after each predetermined time, and the predetermined time may be, but is not limited to, 5 s, so as to ensure the effectiveness of the load-pulling, and avoid that the rapid load changes of the VR inverter affect the determination result.

As an embodiment, a voltage collection terminal of the BMC is connected to the output terminal of the VR inverter, and after the load-pulling the electronic load at the predetermined frequency, the predetermined step and the predetermined maximum load-pull current to load-pull the current of the VR inverter until the load-pull current of the VR inverter is the predetermined maximum load-pull current, the method further includes:

determining a voltage correction coefficient of the BMC based on output voltage of the VR inverter collected by the BMC and the output voltage of the VR inverter collected by the digital multimeter after each load-pulling of the electronic load at the end of load-pulling; and correcting a voltage monitoring value of the BMC based on the voltage correction coefficient.

The applicant considers that in the disclosure, the output voltage of the VR inverter is collected by the digital multimeter to determine whether the output of the VR inverter is stable. However, when the VR inverter is actually put into operation, the digital multimeter is not convenient for a user to obtain the output voltage of the VR inverter.

In order to solve the above technical problems, in the disclosure, the voltage collection terminal of the BMC is connected to the output terminal of the VR inverter. The output voltage of the VR inverter is collected by the BMC, so as to display the output voltage of the VR inverter for the users when needed. However, due to the accuracy of the voltage collected by the BMC, there may be errors in the output voltage of the VR inverter collected by the BMC. In order to avoid the user from obtaining the wrong output voltage of the VR inverter, in the disclosure, the VR inverter is corrected, and the voltage monitoring value of the BMC is also corrected based on the output voltage of the VR inverter collected by the digital multimeter, thereby ensuring the accuracy of the voltage collected by the BMC.

It should be noted that in present disclosure, the BMC collects the output voltage of the VR inverter. It detects the output voltage of the VR inverter via its own ADC voltage monitoring trace.

As an embodiment, the determining the voltage correction coefficient of the BMC based on the output voltage of the VR inverter collected by the BMC and the output voltage of the VR inverter collected by the digital multimeter after each load-pulling of the electronic load at the end of load-pulling includes:

determining voltage offsets obtained by dividing the output voltage of the VR inverter collected by the BMC by the output voltage of the VR inverter collected by the digital multimeter after each load-pulling of the electronic load at the end of load-pulling;

calculating an average value of the voltage offsets which is the voltage correction coefficient; and correcting the voltage monitoring value of the BMC based on the voltage correction coefficient includes:

multiplying the output voltage of the VR inverter collected by the BMC by the voltage correction coefficient.

In the disclosure, the voltage correction coefficient of the BMC is determined. The output voltage of VR inverter collected by the BMC after each load-pulling of the electronic load is divided by the output voltage of VR inverter collected by digital multimeter to obtain voltage offsets. An average value of voltage offsets is set as the voltage correction coefficient. The output voltage of VR inverter collected by the BMC is multiplied by the voltage correction coefficient to correct the voltage monitoring value of the BMC, thereby ensuring the accuracy of the voltage collected by the BMC.

It should be noted that the output voltage of the VR inverter collected by the BMC after each load-pulling of the electronic load is divided by the output voltage of the VR inverter collected by the digital multimeter. The BMC and the digital multimeter collects output voltages for 10 times, respectively, a first output voltage collected by the BMC is divided by a first output voltage collected by the digital multimeter to obtain a first voltage offset, a second output voltage collected by the BMC is divided by a second output voltage collected by the digital multimeter to obtain a second voltage offset, etc., and so on, so as to determine 10 voltage offsets, and an average value of 10 voltage offsets is calculated, that is, the voltage correction coefficient is determined.

Figure 4:
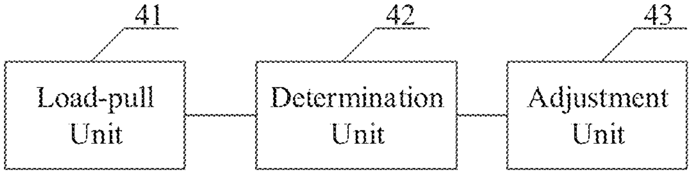
FIG. 4 is a schematic diagram of a structure of a correction system provided in the disclosure.

As shown in FIG. 4, FIG. 4 is a schematic diagram of a structure of a correction system provided in the disclosure. The correction system is applied to a processor. The correction device includes an electronic load and a digital multimeter both connected to an output terminal of a VR inverter in a server, and a digital potentiometer provided between the output terminal and the feedback terminal of the VR inverter. A control terminal of the digital potentiometer is connected to the BMC in the server. A first data exchange terminal of the processor is connected to a data exchange terminal of the BMC, and a second data exchange terminal of the processor is connected to a control terminal of the electronic load and an output terminal of the digital potentiometer. The system includes:

a load-pull unit 41 for load-pulling the electronic load at a predetermined frequency, a predetermined step and a predetermined maximum load-pull current to load-pull a current of the VR inverter until a load-pull current of the VR inverter is the predetermined maximum load-pull current;

a determination unit 42 for determining whether an average voltage value of output voltage of the VR inverter collected by the digital multimeter after each load-pulling of the electronic load is within the predetermined voltage range at the end of load-pulling; and an adjustment unit 43 for adjusting an impedance of the digital potentiometer by the BMC until the average voltage value is within the predetermined voltage range when the average voltage value is not within the predetermined voltage range.

For the introduction of the correction system provided in the disclosure, please refer to the above method embodiment, and in the present disclosure, details are not described herein again.

Figure 5:
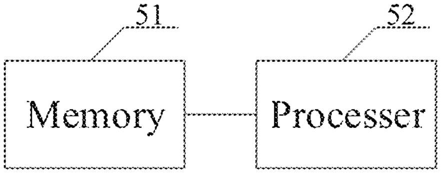
FIG. 5 is a schematic diagram of a structure of a correction device provided in the disclosure.

As shown in FIG. 5, FIG. 5 is a schematic diagram of a structure of a correction device provided in the disclosure. The correction device includes:

a memory 51 for storing a computer program; and a processor 52 for executing the computer program to implement steps of the above correction method.

For the introduction of the correction device provided in the disclosure, please refer to the above method embodiments, and in the present disclosure, details are not described herein again.

For the introduction of the correction device provided in the disclosure, please refer to the above method embodiment, and in the present disclosure, details are not described herein again.

The computer non-transitory readable storage medium in the disclosure stores a computer program, and the computer program is executed by the processor 52 to implement steps of the above correction method.

For the introduction of the computer non-transitory readable storage medium provided in the disclosure, please refer to the above method embodiments, and in the present disclosure, details are not described herein again.

It should be noted that relational terms such as first and second are used merely to distinguish one entity or operation from another entity or operation herein, and do not necessarily require or imply the existence of any such actual relationship or order between these entities or operations. Furthermore, terms “comprise”, “include” or any other variants are intended to encompass non-exclusive inclusion, such that a process, a method, an article or a device including a series of elements not only include those elements, but also includes other elements not listed explicitly or includes intrinsic elements for the process, the method, the article, or the device. Without any further limitation, an element defined by the phrase “comprising one” does not exclude existence of other same elements in the process, the method, the article, or the device that includes the elements.

The foregoing description of the disclosed embodiments enables a person skilled in the art to implement or use the present disclosure. Obviously, the person skilled in the art will make many modifications to these embodiments, the general principles defined in the disclosure may be achieved in the other embodiments without departing from the spirit or scope of the present disclosure. Therefore, the present disclosure will not be limited to the embodiments shown herein, but to conform to the maximum extent of principles and new features that are disclosed herein.

The invention claimed is:

1. A correction method, wherein the correction method is applied to a processor, a correction device comprises an electronic load and a digital multimeter both connected to an output terminal of a VR inverter in a server, and a digital potentiometer provided between the output terminal and a feedback terminal of the VR inverter, a control terminal of the digital potentiometer is connected to a BMC in the server, a first data exchange terminal of the processor is connected to a data exchange terminal of the BMC, a second data exchange terminal of the processor is connected to a control terminal of the electronic load and an output terminal of the digital multimeter, and the method comprises:

load-pulling the electronic load at a predetermined frequency, a predetermined step and a predetermined maximum load-pull current to load-pull a current of the VR inverter until a load-pull current of the VR inverter is the predetermined maximum load-pull current;

determining whether an average voltage value of output voltage of the VR inverter collected by the digital multimeter after each load-pulling of the electronic load is within the predetermined voltage range at the end of load-pulling; and adjusting an impedance of the digital potentiometer by the BMC until the average voltage value is within the predetermined voltage range when the average voltage value of output voltage of the VR inverter collected by the digital multimeter is not within the predetermined voltage range;

wherein the load-pulling the electronic load at the predetermined frequency, the predetermined step and the predetermined maximum load-pull current to load-pull the current of the VR inverter until the load-pull current of the VR inverter is the predetermined maximum load-pull current comprises:

setting a number of times for a first load-pulling as a current number of times for load-pulling;

load-pulling the electronic load for the current number of times;

determining current output voltage of the VR inverter collected by the digital multimeter;

determining whether the load-pull current of the VR inverter is the predetermined maximum load-pull current;

setting next number of the current number of times as the current number of times and returning to step “load-pulling the electronic load for the current number of times” after a predetermined time when the load-pull current of the VR inverter is not the predetermined maximum load-pull current, wherein a difference between the load-pull current of the VR inverter after load-pulling for the current number of times and the load-pull current of the VR inverter after load-pulling for previous number time of the current number of times is the predetermined step; and ending load-pulling when the load-pull current of the VR inverter is the predetermined maximum load-pull current.

2. The method according to claim 1, wherein the adjusting the impedance of the digital potentiometer by the BMC until the average voltage value is within the predetermined voltage range comprises:

S21: adjusting the impedance of the digital potentiometer by the BMC;

S22: load-pulling the electronic load at the predetermined frequency, the predetermined step and the predetermined maximum load-pull current to load-pull the current of the VR inverter;

S23: determining the output voltage of the VR inverter collected by the digital multimeter after each load-pulling of the electronic load;

S24: calculating the average voltage value of the output voltage of the VR inverter during the load-pulling of the current of the electronic load after the load-pull current of the VR inverter is the predetermined maximum load-pull current;

S25: determining whether the average voltage value is within the predetermined voltage range, and proceeding to step S26 when the average voltage value is within the predetermined voltage range, and returning to step S21 when the average voltage value is not within the predetermined voltage range; and S26: generating information that the VR inverter is ready for operation.

3. The method according to claim 2, wherein the determining the output voltage of the VR inverter collected by the digital multimeter after each load-pulling of the electronic load comprises:

determining the output voltage of the VR inverter collected by the digital multimeter after a predetermined interval after each load-pulling of the electronic load.

4. The method according to claim 1, wherein the adjusting the impedance of the digital potentiometer by the BMC until the average voltage value is within the predetermined voltage range comprises:

adjusting the impedance of the digital potentiometer to decrease the impedance of the digital potentiometer when the average voltage value is greater than a maximum value of the predetermined voltage range, so that the average voltage value is within the predetermined voltage range.

5. The method according to claim 1, wherein the adjusting the impedance of the digital potentiometer by the BMC until the average voltage value is within the predetermined voltage range comprises:

adjusting the impedance of the digital potentiometer to increase the impedance of the digital potentiometer when the average voltage value is less than a maximum value of the predetermined voltage range, so that the average voltage value is within the predetermined voltage range.

6. The method according to claim 1, wherein a voltage collection terminal of the BMC is connected to the output terminal of the VR inverter, and after the load-pulling the electronic load at the predetermined frequency, the predetermined step and the predetermined maximum load-pull current to load-pull the current of the VR inverter until the load-pull current of the VR inverter is the predetermined maximum load-pull current, the method further comprises:

determining a voltage correction coefficient of the BMC based on output voltage of the VR inverter collected by the BMC and the output voltage of the VR inverter collected by the digital multimeter after each load-pulling of the electronic load at the end of load-pulling; and correcting a voltage monitoring value of the BMC based on the voltage correction coefficient.

7. The method according to claim 6, wherein the determining the voltage correction coefficient of the BMC based on the output voltage of the VR inverter collected by the BMC and the output voltage of the VR inverter collected by the digital multimeter after each load-pulling of the electronic load at the end of load-pulling comprises:

determining voltage offsets obtained by dividing the output voltage of the VR inverter collected by the BMC by the output voltage of the VR inverter collected by the digital multimeter after each load-pulling of the electronic load at the end of load-pulling;

calculating an average value of the voltage offsets which is the voltage correction coefficient; and correcting the voltage monitoring value of the BMC based on the voltage correction coefficient comprises:

multiplying the output voltage of the VR inverter collected by the BMC by the voltage correction coefficient.

8. The method according to claim 1, wherein the method further comprises:

load-pulling the electronic load at the predetermined frequency, the predetermined step and the predetermined maximum load-pull current to load-pull the current of the VR inverter until the load-pull current of the VR inverter is a predetermined minimum load-pull current;

determining whether the average voltage value of output voltage of the VR inverter collected by the digital multimeter after each load-pulling of the electronic load is within the predetermined voltage range at the end of load-pulling; and adjusting the impedance of the digital potentiometer by the BMC until the average voltage value is within the predetermined voltage range when the average voltage value of output voltage of the VR inverter collected by the digital multimeter is not within the predetermined voltage range.

9. The method according to claim 1, wherein after the load-pulling the electronic load at the predetermined frequency, the predetermined step and the predetermined maximum load-pull current to load-pull the current of the VR inverter until the load-pull current of the VR inverter is the predetermined maximum load-pull current, the method further comprises:

detecting the output voltage of said VR inverter by the digital multimeter for the current number of times after each load-pulling of the electronic load.

10. The method according to claim 1, wherein the adjusting the impedance of the digital potentiometer by the BMC until the average voltage value is within the predetermined voltage range comprises:

increasing or decreasing the impedance of the digital potentiometer by the BMC until the average voltage value is within the predetermined voltage range.

11. The method according to claim 1, wherein the method further comprises:

obtaining, by the processor, the output voltage collected by the digital multimeter or controlling the electronic load via a GPIB bus.

12. The method according to claim 1, wherein the method further comprises:

interacting, by the processor, with the BMC for data exchange via a serial bus.

13. The method according to claim 1, wherein the method further comprises:

transmitting, by the BMC, control signals via an I2C bus during controlling the digital potentiometer.

14. The method according to claim 1, wherein the predetermined time is a period corresponding to the predetermined frequency.

15. The method according to claim 1, wherein the method further comprises:

detecting, by the BMC, the output voltage of the VR inverter via an ADC voltage monitoring trace.

16. The method according to claim 7, wherein the determining the voltage offsets obtained by dividing the output voltage of the VR inverter collected by the BMC by the output voltage of the VR inverter collected by the digital multimeter after each load-pulling of the electronic load at the end of load-pulling comprises:

dividing the output voltage of the VR inverter collected by the BMC for the current number of times by the output voltage of the VR inverter collected by the digital multimeter for the current number of times at the end of each load-pulling, so as to obtain respective voltage offsets after each load-pulling of the electronic load.

17. A correction system, wherein the correction system is applied to a processor, a correction device comprises an electronic load and a digital multimeter both connected to an output terminal of a VR inverter in a server, and a digital potentiometer provided between the output terminal and a feedback terminal of the VR inverter, a control terminal of the digital potentiometer is connected to a BMC in the server, a first data exchange terminal of the processor is connected to a data exchange terminal of the BMC, a second data exchange terminal of the processor is connected to a control terminal of the electronic load and an output terminal of the digital multimeter, and the system comprises:

a load-pull unit for load-pulling the electronic load at a predetermined frequency, a predetermined step and a predetermined maximum load-pull current to load-pull a current of the VR inverter until a load-pull current of the VR inverter is the predetermined maximum load-pull current;

a determination unit for determining whether an average voltage value of output voltage of the VR inverter collected by the digital multimeter after each load-pulling of the electronic load is within the predetermined voltage range at the end of load-pulling; and an adjustment unit for adjusting an impedance of the digital potentiometer by the BMC until the average voltage value is within the predetermined voltage range when the average voltage value of output voltage of the VR inverter collected by the digital multimeter is not within the predetermined voltage range;

wherein the load-pull unit is further configured for:

setting a number of times for a first load-pulling as a current number of times for load-pulling;

load-pulling the electronic load for the current number of times;

determining current output voltage of the VR inverter collected by the digital multimeter;

determining whether the load-pull current of the VR inverter is the predetermined maximum load-pull current;

setting next number of the current number of times as the current number of times and returning to step "load-pulling the electronic load for the current number of times" after a predetermined time when the load-pull current of the VR inverter is not the predetermined maximum load-pull current, wherein a difference between the load-pull current of the VR inverter after load-pulling for the current number of times and the load-pull current of the VR inverter after load-pulling for previous number time of the current number of times is the predetermined step; and ending load-pulling when the load-pull current of the VR inverter is the predetermined maximum load-pull current.

18. A correction device, comprising:

a memory for storing a computer program;

a processor for executing the computer program to implement steps of the correction method according to claim 1.

19. A computer non-transitory readable storage medium, wherein the computer non-transitory readable storage medium stores a computer program, and the computer program is executed by the processor to implement steps of the correction method according to claim 1.

* * * * *